(12) United States Patent
Meade et al.

(10) Patent No.: US 11,322,629 B2
(45) Date of Patent: *May 3, 2022

(54) METHOD AND OPTOELECTRONIC STRUCTURE PROVIDING POLYSILICON PHOTONIC DEVICES WITH DIFFERENT OPTICAL PROPERTIES IN DIFFERENT REGIONS

(71) Applicants: Micron Technology, Inc., Boise, ID (US); Massachusetts Institute of Technology, Cambridge, MA (US)

(72) Inventors: Roy Meade, Boise, ID (US); Karan Mehta, Cambridge, MA (US); Efraim Megged, Mata (IL); Jason Orcutt, Katonah, NY (US); Milos Popovic, Boulder, CO (US); Rajeev Ram, Arlington, MA (US); Jeffrey Shainline, Boulder, CO (US); Zvi Sternberg, Metar (IL); Vladimir Stojanovic, Berkeley, CA (US); Ofer Tehar-Zahav, Hadera (IL)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/145,301

(22) Filed: Jan. 9, 2021

(65) Prior Publication Data

US 2021/0135025 A1 May 6, 2021

Related U.S. Application Data

(60) Continuation of application No. 16/384,037, filed on Apr. 15, 2019, now Pat. No. 10,903,377, which is a
(Continued)

(51) Int. Cl.
*H01L 31/0232* (2014.01)
*H01L 31/0368* (2006.01)
(Continued)

(52) U.S. Cl.
CPC .... *H01L 31/02327* (2013.01); *H01L 27/1443* (2013.01); *H01L 31/03682* (2013.01);
(Continued)

(58) Field of Classification Search
CPC ............ H01L 31/02327; H01L 31/182; H01L 31/03682; H01L 27/1443; H01L 31/1804; Y02P 70/50; Y02E 10/546
See application file for complete search history.

(56) References Cited

U.S. PATENT DOCUMENTS

| 5,014,096 A | * | 5/1991 | Matsuda | ................ | G06N 3/067 |
| | | | | | 257/83 |
| 9,368,653 B1 | * | 6/2016 | Assefa | ............... | H01L 21/02274 |

(Continued)

FOREIGN PATENT DOCUMENTS

WO    WO-2016033111 A2 *  3/2016  ........... H01L 31/182

OTHER PUBLICATIONS

Bogaerts, W., et al. "Photonic integrated circuits in Silicon-on-Insulator", Photonic Research Group, Ghent University, pp. 151-153.
(Continued)

*Primary Examiner* — Earl N Taylor
(74) *Attorney, Agent, or Firm* — Perkins Coie LLP (57) ABSTRACT

Method and structural embodiments are described which provide an integrated structure using polysilicon material having different optical properties in different regions of the structure.

17 Claims, 7 Drawing Sheets

Related U.S. Application Data continuation of application No. 15/679,028, filed on Aug. 16, 2017, now Pat. No. 10,312,388, which is a division of application No. 14/467,449, filed on Aug. 25, 2014, now Pat. No. 9,768,330.

(51) Int. Cl.
*H01L 27/144* (2006.01)
*H01L 31/18* (2006.01)

(52) U.S. Cl.
CPC ........ *H01L 31/182* (2013.01); *H01L 31/1804* (2013.01); *Y02E 10/546* (2013.01); *Y02P 70/50* (2015.11)

(56) References Cited

U.S. PATENT DOCUMENTS

| | | | | |
|---|---|---|---|---|
| 9,768,330 | B2* | 9/2017 | Meade | H01L 31/02327 |
| 10,312,388 | B2* | 6/2019 | Meade | H01L 31/02327 |
| 10,903,377 | B2* | 1/2021 | Meade | H01L 27/1443 |
| 2005/0236619 | A1* | 10/2005 | Patel | H01L 27/1443 |
| | | | | 257/57 |
| 2007/0101927 | A1* | 5/2007 | Keyser | G02B 6/132 |
| | | | | 117/20 |
| 2010/0140708 | A1* | 6/2010 | Hill | G02B 6/136 |
| | | | | 257/348 |
| 2011/0133063 | A1* | 6/2011 | Ji | G02B 6/124 |
| | | | | 250/227.24 |
| 2012/0129302 | A1* | 5/2012 | Assefa | H01L 31/103 |
| | | | | 438/154 |
| 2013/0267074 | A1* | 10/2013 | Hall | H01L 29/42332 |
| | | | | 438/299 |
| 2014/0027826 | A1* | 1/2014 | Assefa | H01L 27/1443 |
| | | | | 257/290 |
| 2014/0045292 | A1* | 2/2014 | Tsukagoshi | H01L 27/14685 |
| | | | | 438/65 |
| 2014/0091374 | A1* | 4/2014 | Assefa | H01L 27/1443 |
| | | | | 257/290 |
| 2014/0185981 | A1* | 7/2014 | Assefa | H01L 27/14 |
| | | | | 385/14 |
| 2014/0191302 | A1* | 7/2014 | Assefa | H01L 27/0922 |
| | | | | 257/290 |
| 2014/0191326 | A1* | 7/2014 | Assefa | H01L 27/0922 |
| | | | | 257/369 |
| 2016/0056309 | A1* | 2/2016 | Meade | H01L 31/03682 |
| | | | | 257/49 |
| 2017/0365726 | A1* | 12/2017 | Meade | H01L 31/02327 |
| 2019/0245100 | A1* | 8/2019 | Meade | H01L 31/182 |
| 2021/0135025 | A1* | 5/2021 | Meade | H01L 31/182 |

OTHER PUBLICATIONS

Geis, et al., "All silicon infrared photodiodes: photo response and effects of processing temperature", Optics Express, Dec. 10, 2007, vol. 15, No. 25.

Knights, et al., "Silicon-on-insulator waveguide photodetector with self-ion-implantation-engineered-enhanced infrared response", J. Vac. Sci, Technol. A 24(3), May/Jun. 2006.

Marsh, John, "Quantum well intermixing", Semicond. Sci. Technol. 8 (1993), 1136-1155.

Preston, et al., "Waveguide-integrated telecom-wavelength photodiode in deposited silicon", Optics Letters, vol. 36, No. 1, Jan. 1, 2011.

Yamada, Koji, "Chapter 1, Silicon Photonic Wire Waveguides: Fundamentals and Applications", Topics in Applied Physics 119, 1-29 (2011).

\* cited by examiner

METHOD AND OPTOELECTRONIC STRUCTURE PROVIDING POLYSILICON PHOTONIC DEVICES WITH DIFFERENT OPTICAL PROPERTIES IN DIFFERENT REGIONS

CROSS-REFERENCE TO RELATED APPLICATIONS

This application is a continuation of U.S. application Ser. No. 16/384,037, filed Apr. 15, 2019; which is a continuation of U.S. application Ser. No. 15/679,028, filed Aug. 16, 2017, now U.S. Pat. No. 10,312,388; which is a division of U.S. application Ser. No. 14/467,449, filed Aug. 25, 2014, now U.S. Pat. No. 9,768,330; each of which is incorporated herein by reference in its entirety.

GOVERNMENT RIGHTS

This invention was made with Government support under Agreement HR0011-11-9-0009 awarded by DARPA. The Government has certain rights in the invention.

FIELD OF THE INVENTION

Disclosed method and structural embodiments are directed to providing an integrated optoelectronic structure containing photonic devices having different optical properties in different regions of the structure.

BACKGROUND OF THE INVENTION

Optoelectronic integrated structures are fabricated to have photonic devices with different optical properties. Often such devices are fabricated using materials that either strongly interact with guiding light through one of an absorption/gain process for photon signal detection, or which allow guided light to propagate with minimal attenuation, such as in a waveguide. The conventional manner of achieving these different results is to use different elements and materials in differing spatial locations in the optoelectronic integrated circuit. In group III-V photonic integrated circuits, materials such as $In_{1-x} Ga_x As_{1-y} P_y$ of varying mole fractions can be employed for this purpose. In silicon-based optoelectronic integrated circuits other materials such as germanium or alloys thereof are utilized in combination with silicon. The integration of different materials in different regions in an optoelectronic integrated structures can add significantly to the cost and complexity of fabrication.

It would be desirable to provide a low cost and easily integrated optoelectronic integrated structure in which the same optical material can, in some regions, provide an optical device which functions as signal detector having associated high signal attenuation, and other regions as a low loss waveguide.

DETAILED DESCRIPTION OF THE INVENTION

Method and structural embodiments described herein provide a polysilicon material with different absorption losses in different regions of an optoelectronic integrated structure such that low loss waveguides and high absorption signal detector photonic devices can be formed in the different regions. Method and apparatus embodiments also provide an optoelectronic structure in which a polysilicon material is used to form transistor gates, a low loss waveguide, and a defect-state photodetector in different regions of the optoelectronic structure. Generally, polysilicon, which is used for transistor gate formation in CMOS circuits, has a high optical signal absorption. As a result, method and structural embodiments employed herein provide polysilicon material having lower optical absorption in regions intended for optical waveguide formation, while leaving the inherent properties of a higher absorption in other regions of the optoelectronic structure for transistor gate formation and for defect-state photodetector formation.

Various method and structural embodiments of the invention will now be described in connection with the drawings. It should be understood that the specific method and structural embodiments described are examples and that modifications can be made without departing from the spirit or scope of the invention.

Figure 1:
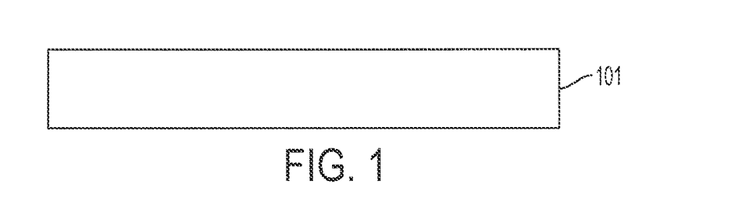
FIG. 1 is a cross-section of a starting substrate for use in fabricating structural embodiments described herein.

FIG. 1 illustrates a starting structure in the form of a substrate 101. The substrate 101 can be formed of various materials on which optoelectronic integrated devices can be constructed, for example, substrate 101 can be a semiconductor substrate, for example, a silicon substrate.

Figure 2:
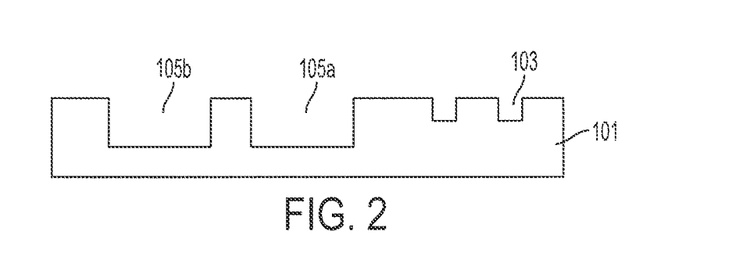
FIG. 2 is a cross-section of the FIG. 1 structure after trench etching.

FIG. 2 illustrates formation of various shallow trench regions 103 and deeper trench regions 105a and 105b within the substrate 101. Conventional photo lithographic techniques employing a pattern photoresist and etching can be used to form the trenches 103, 105a and 105b.

Figure 3:
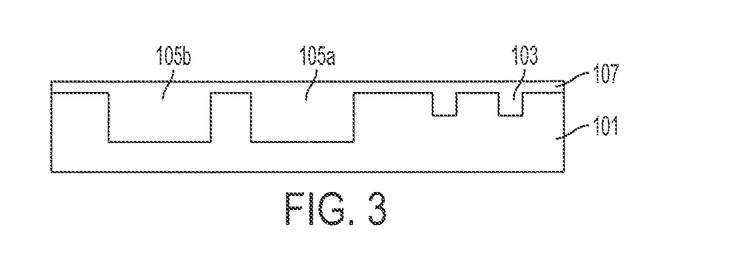
FIG. 3 is a cross-section of the FIG. 2 structure after a trench fill.
Figure 4:
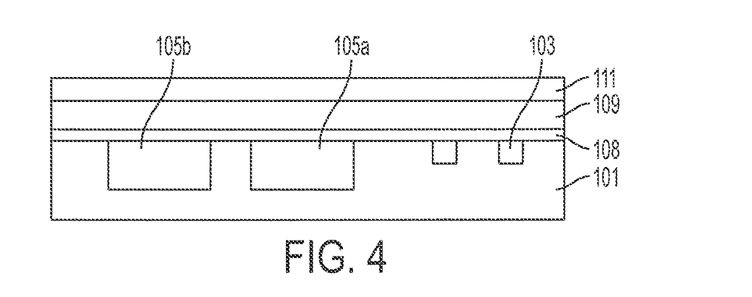
FIG. 4 is a cross-section of the FIG. 3 structure after a planarization of the trench fill and the deposition of oxide and polysilicon materials.

Following the trench formation illustrated in FIG. 2, and as illustrated in FIG. 3, the trench areas 103, 105a, 105b are filled with an oxide material 107, for example, silicon dioxide. Shallow filled trench areas 103 will be used for electronic device isolation, while the deeper filled trenches 105a, 105b will be used for optically isolating photonic devices from the substrate 101. Following this, the deposited oxide material 107 can be planarized down to the surface of the substrate 101 after which, as shown in FIG. 4, a further thin oxide 108, for example, silicon dioxide, can be grown or deposited on exposed surfaces of substrate 101 as a gate oxide for later transistor formation. Alternatively, the planarization of the oxide fill 107, as illustrated in FIG. 3 can be such that a thin layer of oxide 107 remains over the entire surface of the substrate 101 as a gate oxide 108.

Figure 5:
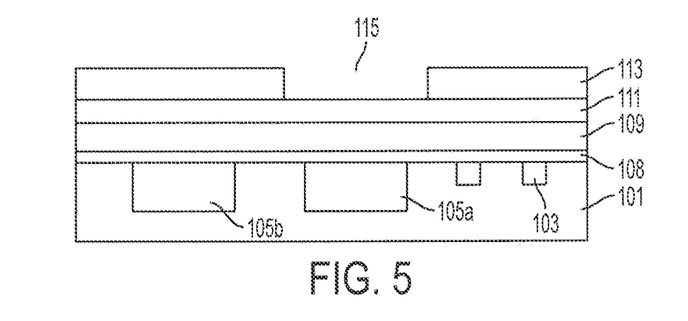
FIG. 5 is a cross-section of the FIG. 4 structure after a patterned photoresist is applied.

In either case, as further illustrated in FIG. 4, after the formation of a thin gate oxide material 108, a polysilicon material 109 and an oxide material 11, e.g., silicon dioxide, are sequentially blanket deposited over the thin oxide material 108. Following this, and as shown in FIG. 5, a pattern photoresist material 113 is formed having an opening 115 over the filled trench 105a. This opening is used, as shown in FIG. 6, as a mask for an etch through the oxide material 111 and polysilicon material 109 to the level of the gate oxide material 108, forming opening 116.

Figure 6:
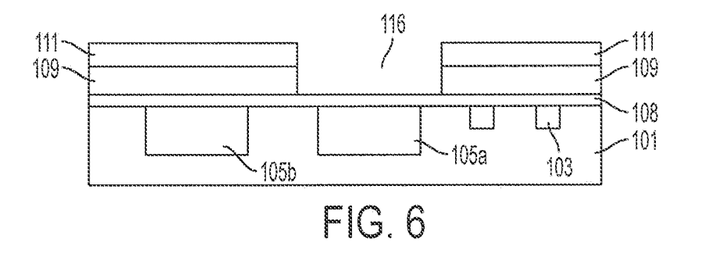
FIG. 6 is a cross-section of the FIG. 5 structure after an etch operation.
Figure 7:
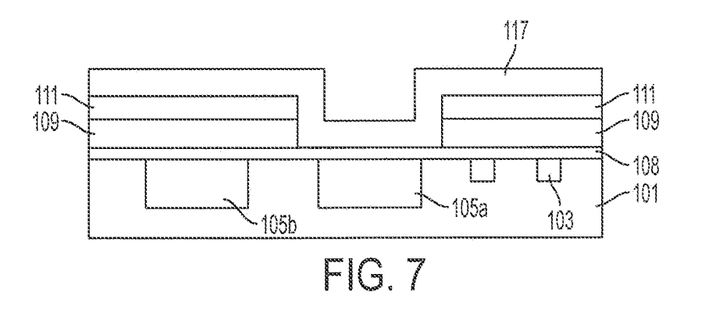
FIG. 7 is a cross-section of the FIG. 6 structure after application of an amorphous silicon layer.
Figure 8:
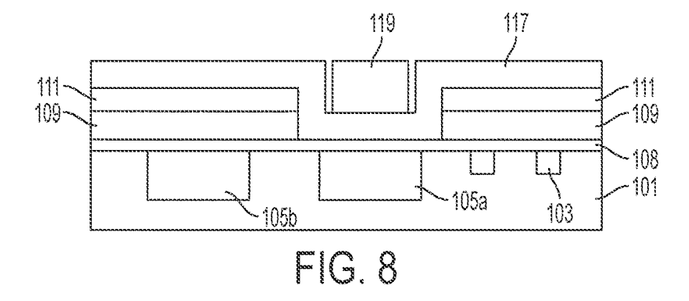
FIG. 8 is a cross-section of the FIG. 7 structure after a patterned photoresist is applied.
Figure 9:
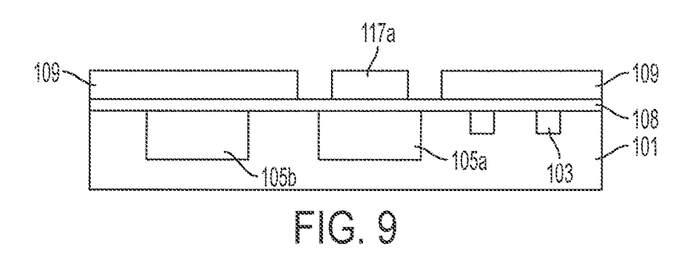
FIG. 9 is a cross-section of the FIG. 8 structure after an etch operation.

As shown in FIG. 7, an amorphous silicon 117 is blanket deposited over the FIG. 6 structure including within the opening 116 shown in FIG. 6. As shown in FIG. 8, a photoresist 119 is patterned and located within opening 116 and over the filled trench 105a and amorphous silicon 117 within the opening 116 (FIG. 6). The photoresist 119 is used as a mask during an etching of the amorphous silicon 117 and oxide material 111 resulting in the structure illustrated in FIG. 9. FIG. 9 now has the original polysilicon layer 109 and, separated therefrom, and an amorphous silicon material 117 located over the deep trench 105a, which are both formed in the same plane at the same fabrication level. The FIG. 9 structure is subject to an annealing process which crystallizes the amorphous silicon 117, into a polysilicon material, denoted as 117a. Because the polysilicon material 117a started as an amorphous silicon layer which crystallizes during annealing, it has a lower optical signal absorption characteristic compared with the higher optical signal absorption characteristics of polysilicon material 109.

Figure 10:
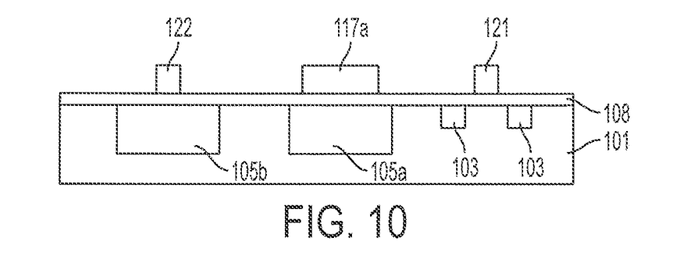
FIG. 10 is a cross-section of the FIG. 9 structure after a further etch operation.

FIG. 10 further illustrates a patterned etching of the polysilicon material 109 to form, on the right side of FIG. 10, a gate 121 positioned between filled shallow trenches 103 for a transistor structure and on the left side, a polysilicon material element 122 which is over the filled deep trench 105b. The polysilicon material 117a, crystallized from amorphous silicon, can be used as a core of a low loss waveguide structure. Polysilicon material 109 has a higher absorption for photons and is suitable for transistor gates, and as a defect-state photodetector.

Figure 11:
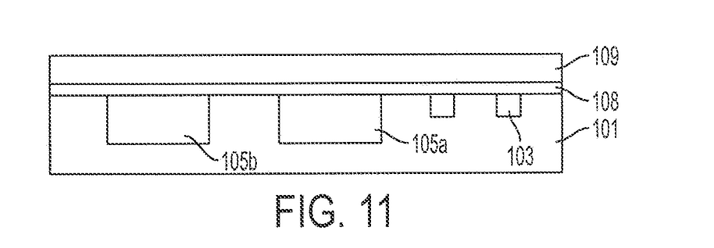
FIG. 11 is a cross-section of a starting structure for a second structural embodiment of the invention.

FIG. 11 is a cross-section of a starting structure for other method and structural embodiments. It illustrates the substrate 101, e.g. silicon substrate, the oxide filled shallow trenches 103 and the oxide filled deeper trench areas 105a and 105b. It also illustrates the gate oxide 108, and polysilicon material 109 over the gate oxide. These materials can be formed in the same manner as described above with reference to FIGS. 1-4.

Figure 12:
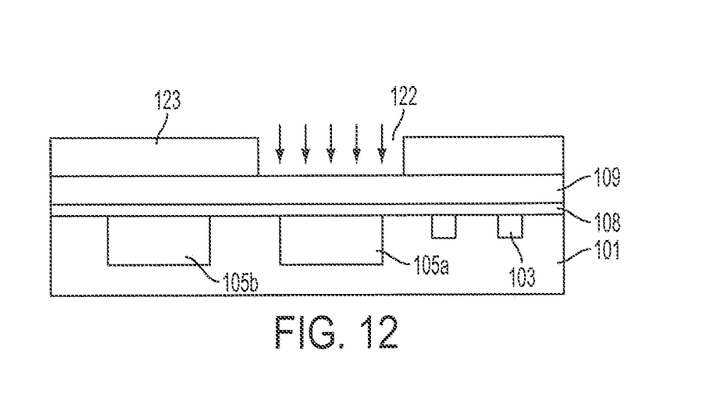
FIG. 12 is a cross-section of the FIG. 11 structure after application of a photoresist and illustrating an implant.
Figure 13:
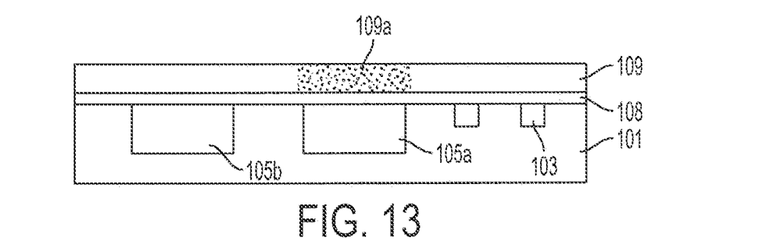
FIG. 13 is a cross-section of the FIG. 12 structure after removal of the photoresist.

FIG. 12 illustrates the formation of a patterned photoresist 123 having opening 122 over the FIG. 11 structure, and over oxide filled trench area 105a, and a subsequent doping implant (shown by arrows) into the polysilicon layer 109 through the opening 122 of the photoresist material 123. The implant in FIG. 12 is a high energy dose of silicon atoms which converts the implanted polysilicon material 109 into amorphous silicon in the region below opening 122. This amorphous silicon region is illustrated in FIG. 13 as amorphous silicon region 109a. This region is then recrystallized back into a polysilicon material through a suitable high temperature anneal. The recrystallized polycrystalline material in region 109a possesses a low photonic loss (lower attenuation) compared with the remaining region of polysilicon material 109.

Figure 14:
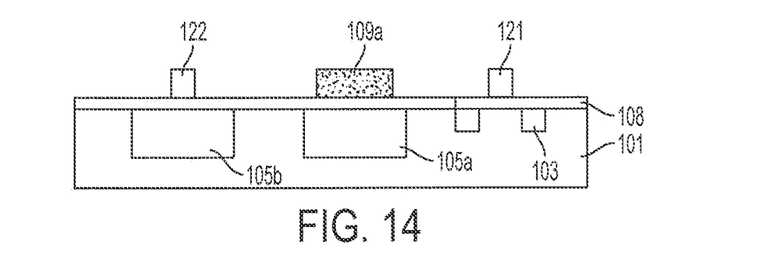
FIG. 14 is a cross-section of the FIG. 13 structure after an etching operation.

FIG. 14 illustrates a subsequent etching of the polysilicon material 109 and 109a to produce a transistor gate 121, a high photon absorption area 122 for use as a photodetector, and a low loss low absorption polysilicon material 109a which can be used as a core for waveguide formation. Once again, the polysilicon materials 109, 109a are formed in the optoelectronic integrated structure of polysilicon material having different properties in different regions of the optoelectronic structure. The lower 109a and higher 109 attenuation polysilicon elements are fabricated in the same plane at a same fabrication level to provide a higher attenuation transistor gate 121 and a higher attenuation defect-state photodetector 122, and a lower attenuation waveguide core 109a.

Figure 15:
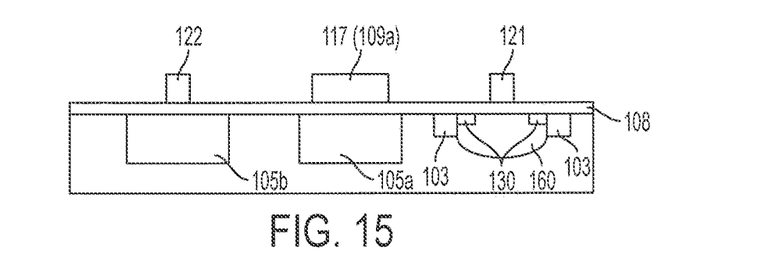
FIG. 15 is a cross-section of the FIG. 14 structural after transistor implants.

FIG. 15 illustrates a starting structure for further processing which can either be the FIG. 14 structure or the FIG. 10 structure, as indicated by the polysilicon material 117 (or 109a) in FIG. 15. FIG. 15 further illustrates further processing by formation of source/drain regions 130 around gate 121 and an additional doped well 160. A threshold voltage (Vt) implant can also be provided. The various implants for determining desired transistor characteristics are well known in the art.

Figure 16:
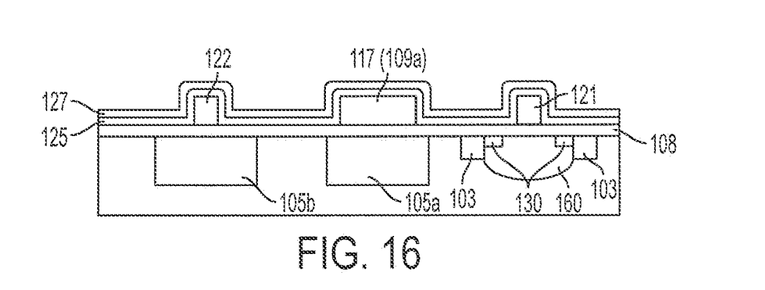
FIG. 16 is a cross-section of FIG. 15 structure after application of an oxide material followed by a nitride material.

FIG. 16 illustrates the subsequent formation of a thin oxide material 125, for example, silicon dioxide, and followed by a thicker nitride material 127, e.g., silicon nitride, as blanket depositions over the FIG. 15 structure.

Figure 17:
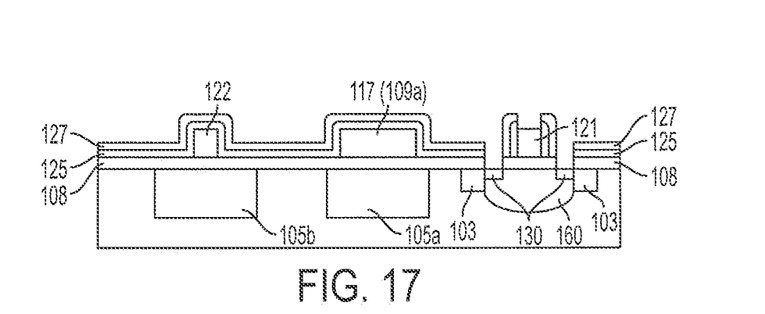
FIG. 17 is a cross-section of the FIG. 16 structure after an etch operation.

FIG. 17 illustrates the FIG. 16 structure after an etching to remove the nitride 127 and oxide 125 materials over the source/drain regions 130 and over the top of the transistor gate 121. This exposes copper areas of the gate 121 polysilicon and substrate containing the source/drain regions for a subsequent silicide operation.

Figure 18:
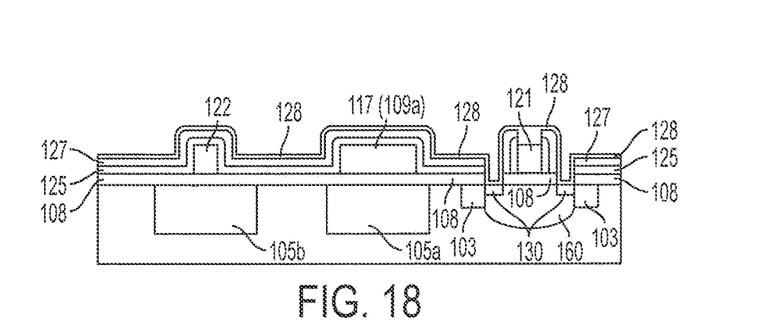
FIG. 18 is a cross-section of the FIG. 17 structure after a silicide operation.

FIG. 17 also illustrates the blanket deposition of a thin metal material 128 over the entire substrate for use in forming a silicide on exposed areas of polysilicon material of gate 121 and semiconductor substrate 101. The metal material can be, for example, chromium. Subsequently, a high temperature anneal converts the upper areas of the polysilicon in the gate 121 and silicon at the source/drain regions 130 into silicide areas 131, 132, shown in FIG. 18, providing highly conductive contacts. After the silicide areas 131, 132 are formed, the metal which remains on the nitride layer 127 and is unreacted is removed by a chemical etch, as further shown in FIG. 18.

Figure 19:
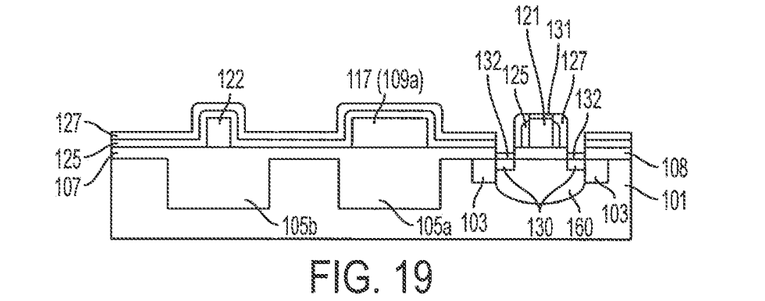
FIG. 19 is a cross-section of the FIG. 18 structure after a further etching operation.

FIG. 19 illustrates the selective etch and removal of the nitride 127 and optionally, the oxide 125, as shown, over the polysilicon area 122, which will be fabricated into a photodetector. It has been observed that removal of the nitride material 127 over the top surface of the polysilicon material 122 for use as a photodetector increases absorption and thus electrical signal output from the fabricated photodetector.

Figure 20:
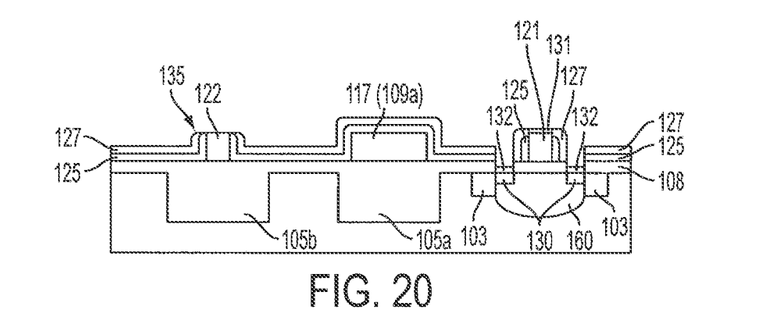
FIG. 20 is a cross-section of the FIG. 19 structure after selective removal of a nitride material.
Figure 21:
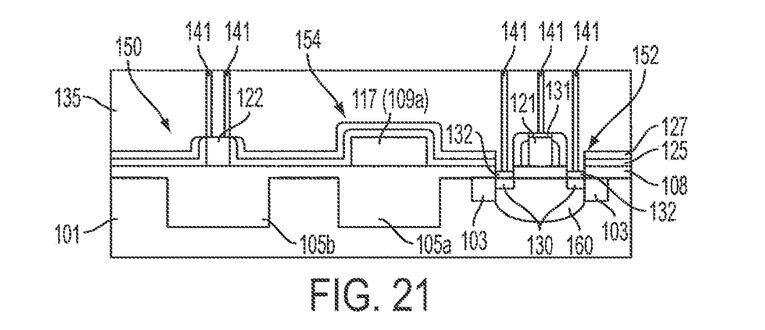
FIG. 21 is a cross-section of the FIG. 20 structure after formation of an oxide material and conductive vias.

FIG. 20 illustrates the subsequent formation of an oxide material 135, for example, SiO$_2$, or BPSG or PSG, over the entire structure and the subsequent formation of conductive vias 141 down to what is now a defect state photodetector 150. At this stage, the polysilicon material 117 (or 109a) is now entirely surrounded by cladding material and can be used as a low loss, low absorption, waveguide 154, the polysilicon material 121 is now a gate for a transistor 152.

The structure illustrated in FIG. 20 can now be further processed to complete an optoelectronic structure by forming interlayer dielectric (ILD) materials and associated metallization materials to interconnect the various photonic devices and circuit devices together, as well known in the art.

As evident from the foregoing, an optoelectronic structure is provided in which a polysilicon material has different attenuation and signal propagation characteristics in different regions. All fabricated polysilicon structures are also fabricated at the same physical level as the transistor gate to form both a low loss, lower absorption waveguide 154 as well as a higher absorption defect state photodetector 150.

While various embodiments of the invention have been described above, the invention is not confined to the specific disclosed method and structural embodiments as many modifications can be made without departing from the spirit or scope of the invention. Accordingly, the invention is not limited by the foregoing description but is only limited by the scope of the appended claims.

What is claimed as new and desired to be protected by Letters Patent of the United Sates is:

1. An integrated structure comprising:
    a substrate;
    an optical isolation region formed in the substrate;
    a photonic device over and vertically aligned with the optical isolation region, the photonic device formed of a first poly silicon material;
    an electronic circuit comprising at least one transistor, wherein a gate of the at least one transistor is formed of a second polysilicon material different from the first polysilicon material and has a top surface coplanar with a top surface of the photonic device.

2. The integrated structure of claim 1, wherein the gate has a bottom surface coplanar with a bottom surface of the photonic device.

3. The integrated structure of claim 1, wherein the photonic device is a first photonic device, and further comprising a second photonic device over the substrate, the second photonic device formed of the second polysilicon material, wherein the first photonic device and second photonic device have coplanar upper surfaces, coplanar lower surfaces and different optical properties.

4. The integrated structure of claim 3, wherein the first and second polysilicon materials have different optical transmission properties.

5. The integrated structure of claim 3, wherein the first and second polysilicon materials reside on a common physical layer of the integrated structure.

6. The integrated structure of claim 3, wherein the second photonic device comprises a defect state photodetector.

7. The integrated structure of claim 1, wherein the first polysilicon material comprises an amorphized and recrystallized polysilicon material.

8. The integrated structure of claim 1, further comprising forming a nitride material over the photonic device.

9. The integrated structure of claim 1, wherein the photonic device comprises a waveguide core.

10. An integrated structure comprising:
    a substrate;
    an optical isolation region formed in the substrate;
    a photonic device over and vertically aligned with the optical isolation region, the photonic device formed of a first poly silicon material; and
    an electronic circuit comprising at least one transistor, wherein a gate of the at least one transistor is formed of a second polysilicon material different from the first polysilicon material and has a top surface coplanar with a top surface of the photonic device and a bottom surface coplanar with a bottom surface of the photonic device,
    wherein the first polysilicon material has a lower attenuation than the second polysilicon material.

11. The integrated structure of claim 10, wherein the photonic device is a first photonic device, and further comprising a second photonic device over the substrate, the second photonic device comprising the second polysilicon material.

12. The integrated structure of claim 11, wherein the first and second photonic devices have different optical transmission properties.

13. The integrated structure of claim 11, wherein the second photonic device comprises a defect state photodetector.

14. The integrated structure of claim 10, wherein the first and second polysilicon materials reside on a common physical layer of the integrated structure.

15. The integrated structure of claim 10, wherein the first polysilicon material comprises an amorphized and recrystallized polysilicon material.

16. The integrated structure of claim 10, further comprising a nitride material over the photonic device.

17. The integrated structure of claim 10, wherein the photonic device comprises a waveguide core.

* * * * *